United States Patent [19]

Wingreen et al.

[11] Patent Number: 5,692,003
[45] Date of Patent: Nov. 25, 1997

[54] QUANTUM-DOT CASCADE LASER

[75] Inventors: Ned Scott Wingreen, Princeton, N.J.; Charles A. Stafford, Geneva, Switzerland

[73] Assignee: NEC Research Institute, Inc., Princeton, N.J.

[21] Appl. No.: 625,029

[22] Filed: Mar. 29, 1996

[51] Int. Cl.[6] ............................................. H01S 3/19
[52] U.S. Cl. ............................ 372/50; 372/45; 372/46
[58] Field of Search ............................... 372/50, 92, 96, 372/45, 46

[56] References Cited

U.S. PATENT DOCUMENTS 5,509,025   4/1996   Capasso et al. ......................... 372/45
5,559,822   9/1996   Pankove et al. ......................... 372/50

Primary Examiner—James W. Davie
Attorney, Agent, or Firm—Jeffery J. Brosemer

[57] ABSTRACT

A quantum-dot cascade laser which eliminates single phonon decays associated with quantum-well devices. The elimination of single phonon decays is realized by a three-dimensional confinement resulting in a several-order-of-magnitude reduction in the threshold current. Dot size, dot density and dot uniformity requirements are presented along with several embodiments.

9 Claims, 3 Drawing Sheets

QUANTUM-DOT CASCADE LASER

FIELD OF THE INVENTION

This invention pertains to the field of semiconductor lasers, and in particular to a quantum-dot cascade laser that eliminates phonon decays associated with conventional, semiconductor cascade lasers.

DESCRIPTION OF THE ART AND PROBLEM

Recent advances in the art such as those disclosed by J. Faist et al., in an article entitled "Quantum Cascade Laser", which appeared in SCIENCE, Vol. 264, pp. 553–556, Apr. 22, 1994, have demonstrated that semiconductor lasers built from a cascade of coupled quantum wells are realizable.

With reference to FIG. 1, there is shown a simplified conduction-band energy diagram of a quantum-well cascade laser showing electrons making a radiative transition to a lower subband. As depicted in this Figure, photons are generated by the transition of an electron from a first excited state of energy $\epsilon_1$ to a ground state of the coupled well of energy $\epsilon_0$.

An important characteristic of quantum-well devices is that the excited and ground states as shown in FIG. 1 are not discrete levels but form bands due to the free movement of electrons in the two dimensions transverse to the direction of conduction band energy variation, i.e., the direction of a current flow. Unfortunately, the dominant electronic decay mechanism in a quantum-well laser is nonradiative, producing an emission of an optic phonon rather than a photon. Inasmuch as the bands are continuous in energy, such transitions are always allowed. Since electron-optic-phonon coupling is much stronger than electron-photon coupling, nonradiative phonon transitions greatly outnumber radiative, photon transitions in quantum-well lasers by approximately 3000 to 1.

As a result of these nonradiative phonon transitions, quantum-well cascade lasers are highly inefficient, and require a large threshold current to initiate useful lasing.

SUMMARY OF THE INVENTION

The above problem is solved and an advance is made over the prior art in accordance with the principles of the invention wherein a semiconductor cascade laser is constructed from an array of quantum dots. Such quantum dot cascade lasers possess the desirable characteristics of quantum-well lasers, while at the same time eliminating the very undesirable nonradiative phonon decays. Consequently, quantum dot cascade lasers constructed according to the teachings of the present invention will exhibit tunable operating frequency, an intrinsically strong and narrow gain spectrum, low threshold current and temperature independent operation.

DETAILED DESCRIPTION

Figure 1:
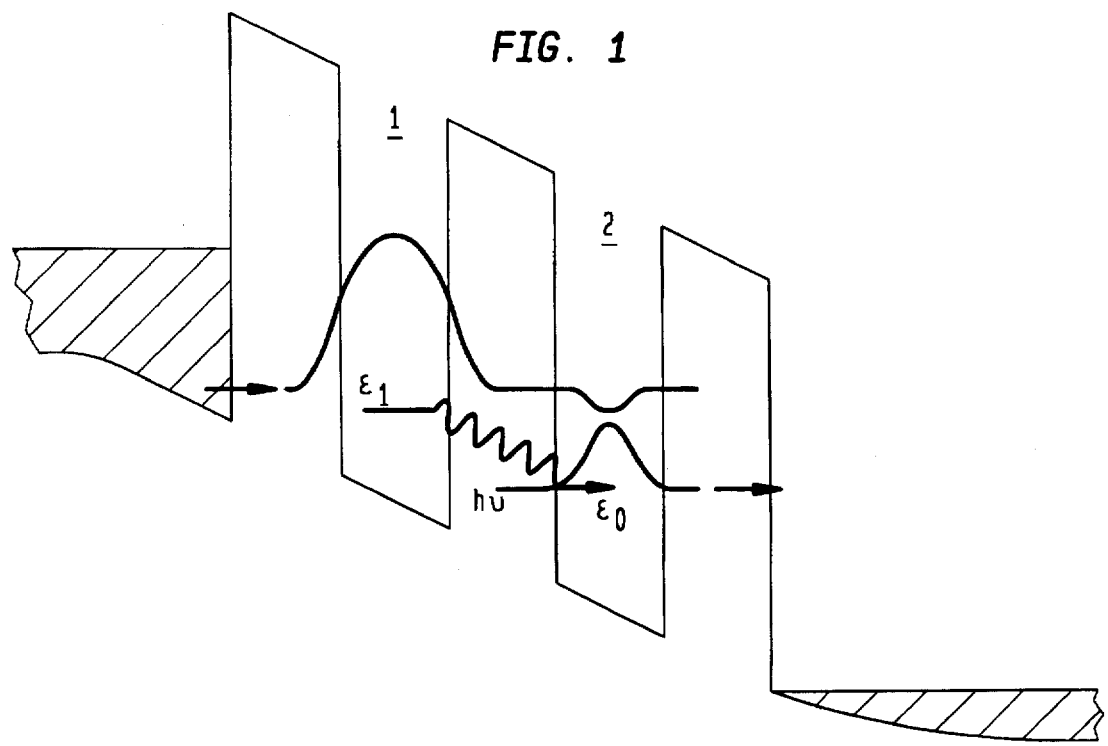
FIG. 1 is a conduction band energy diagram of a prior art cascade showing electrons making a radiative transition to a lower subband.

In order to fully appreciate the quantum-dot cascade laser which is the subject of the present invention, it is useful to compare it with a prior art quantum-well laser. With further reference to FIG. 1, there are shown two electronically coupled dots or alternatively, two electronically coupled wells. Photons are generated by the transition of an electron from the first excited state to the ground state of the coupled dots or coupled wells. In both cases, electrons are injected directly into the excited state by a current tunneling through the upstream barrier. Once an electron is de-excited, it escapes quickly through the downstream barrier so that photon absorption is negligible.

A significant distinction between the quantum-dot laser and prior-art quantum-well lasers is that in the quantum-dot laser, the excited and ground electronic levels as shown in FIG. 1 represent truly discrete states while in the case of a quantum-well laser, the excited and ground electronic levels shown in FIG. 1 represent the bottom of a continuous band of states. Specifically, in the quantum-well laser, electrons form bands due to their free movement in the two dimensions transverse to the direction of conduction-band energy variation shown in FIG. 1 (i.e., the direction of current flow). Consequently, the dominant electronic decay mechanism in the quantum wells is nonradiative, involving emission of an optic phonon rather than a photon. Since the bands are continuous in energy, such transitions are always allowed. Furthermore, since the electron-optic-phonon coupling is much stronger than the electron-photon coupling such nonradiative transitions will always dominate the radiative ones.

In sharp contrast, the rate of radiative decay dominates the nonradiative rate in the quantum-dot laser. Inasmuch as the excited and ground states of the coupled dots are discrete levels, nonradiative decays involve emission of a phonon at the difference energy $\epsilon_1-\epsilon_0$. In general, phonon energies form a continuous band so that such one-phonon decays are allowed. However, if the difference energy $\epsilon_1-\epsilon_0$ is larger than the largest phonon energy (e.g., the optic phonon energy at $\hbar\omega_{LO}=36$ meV in GaAs) then no single phonon can carry away the electronic energy Multiphonon decay processes are still allowed but the rate of these is negligible (except in certain narrow energy bands). The dominant decay mechanism in quantum dots therefore is photon emission.

The size of each of the coupled dots is strongly constrained by the requirement that the energy difference between the excited and ground states exceed the optic-phonon energy $\hbar\omega_{LO}$. Specifically, the energy difference between the lowest states of one of the dots in isolation must exceed $\hbar\omega_{LO}$. The resulting maximum dot size L can be estimated from the energy spacing in a square well of size L, $$\frac{3\pi^2 \hbar^2}{2m^* L^2} > \hbar\omega_{LO}. \tag{1}$$

For GaAs, with an effective mass m*=0.067 m, dots smaller than L≈20 nm in all three dimensions are required.

Figure 2:
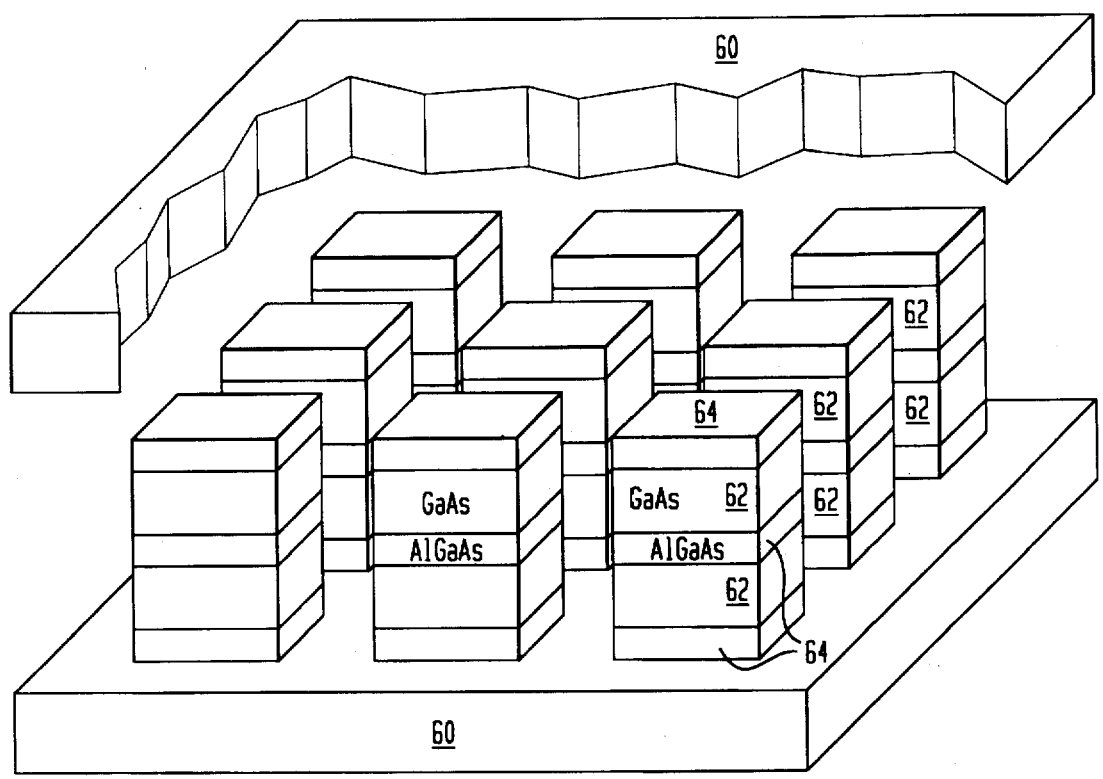
FIG. 2 is a schematic diagram of an array of pairs of coupled dots sandwiched between conducting sheets.

With reference to FIG. 2, there is shown a basic structure (sandwich) of an array of double quantum dots, suitable for the construction of a laser. It includes conducting sheets 60, which provide the basic structural support for the array of double quantum dots and provide conductive pathways to other sandwiches of quantum dots stacked above and below the sandwich. In a preferred embodiment, the conducting sheets may be made of n-doped GaAs, although those skilled in the art can readily appreciate that other materials made from Group III–Group V Elements, or Group II–Group VI elements, could be substituted for the GaAs.

Positioned between the conducting sheets, is an array of quantum dots, spaced to provide a dot density that is effective for lasing. Preferably, and as shown in FIG. 2, the quantum dots 62 are completely separated by, and sandwiched between barrier layers 64. While it is not explicitly shown in FIG. 2, the barrier material completely surrounds each of the double dots on each side, i.e., above, below and in space between adjacent dots. Those skilled in the art will readily appreciate that quantum dots 62 may be made from any suitable material, i.e., GaAs or other Group III–Group V; Group II–Group VI materials, where Group III is B, Al, Ga, In, Ti; Group V is N, P, As, Bi; Group II is Zn, Cd, Hg; and Group VI is O, S, Se, Te, Po and that the barrier layers are likewise made from a suitable barrier material, i.e., AlGaAs.

Laser action will only occur if the gain coefficient $\gamma(\omega)$ exceeds the distributed loss, $$\gamma(\omega) > \alpha_I + \alpha_M, \tag{2}$$

where $\alpha_I$ at is the bulk loss and $\alpha_M = (1/L)\log(1/R)$ is the loss through mirrors. Relation (2) jointly constrains the minimum density of dot pairs and the uniformity of dot sizes. The gain is proportional to the three-dimensional density of coupled dots and is given by:

$$\gamma(\omega) = fN\sigma(\omega), \tag{3}$$

where f is the fraction of coupled dots with an electron in the excited state (we neglect the small fraction of dots with an electron in the ground state) and $\sigma(\omega)$ is the cross section. It is convenient to write $\sigma(\omega)$ as the product of an oscillator strength S and a normalized lineshape function $g(\omega)$, $$\sigma(\omega) = Sg(\omega). \tag{4}$$

In the dipole approximation the oscillator strength is given by:

$$S = \frac{4\pi^2 \alpha \omega_{fi}}{n} |\langle f|\mathbf{r} \cdot \hat{e}|i\rangle|^2 \tag{5}$$

$$\simeq \frac{4\pi^2 \alpha \omega_{fi}}{n} \left(\frac{td}{\hbar \omega_{fi}}\right)^2,$$

where $\alpha = e^2/\hbar c \approx 1/137$ is the fine structure constant, n is the index of refraction, and $\omega_{fi}$ is the transition frequency between initial and final states. The dipole matrix element between initial and final states $\langle f|\mathbf{r} \cdot \hat{e}|i\rangle$ projects the polarization direction $\hat{e}$ on the dipole moment. In the coupled dot, the transition dipole moment lies purely along the current direction so the radiation will be polarized in that direction. In the second line of Equation (5), the dipole matrix element is approximated by the product of the distance between the dots d and interdot hybridization $t/\hbar \omega_{fi}$, where t is the tunnel coupling between dots. The remaining factor is the normalized lineshape function $g(\omega)$. It is assumed that inhomogeneous broadening due to disorder will determine the lineshape. Taking, for convenience, a Lorentzian lineshape with FWHM disorder broadening of $\Delta \omega$, one finds a peak gain coefficient of:

$$\gamma_{peak} = \frac{2fNS}{\pi \Delta \omega}. \tag{6}$$

By equating the peak gain to the total loss, a joint requirement on density and uniformity for a quantum-dot laser can be stated. As described by Saleh and Teich in Fundamentals of Photonics, published by Wiley, New York 1991, the distributed loss for a semiconductor injection laser is at least 10 cm$^{-1}$. The interdot hybridization $t/\hbar \omega_{fi}$ must be sufficiently small such that the spontaneous emission rate $\omega_{sp}$ dominates the leakage rate from the excited state through the downstream barrier. In turn, the spontaneous emission rate must be smaller than the escape rate from the ground state. Assuming a fixed escape rate $\Gamma$ through the downstream barrier, these inequalities require:

$$(t/\hbar \omega_{fi})^2 \Gamma < \omega_{sp} < \Gamma, \tag{7}$$

which clearly limits the hybridization to $(t/\hbar \omega_{fi})^2 \leq 1/10$. Further assuming a transition energy of 100 meV, interdot spacing of d=10 nm, and index of refraction n=3, it is found that lasing requires an excited coupled-dot density to broadening energy ratio of:

$$\frac{fN}{\hbar \Delta \omega} \simeq 1.6 \times 10^{16} \text{cm}^{-3} \text{eV}^{-1}. \tag{8}$$

Hence a 10% disorder broadening of the transition energy (5% nonuniformity), and an excited fraction near f=1, requires a minimum density of one coupled dot pair per (180 nm)$^3$ volume.

Figure 3:
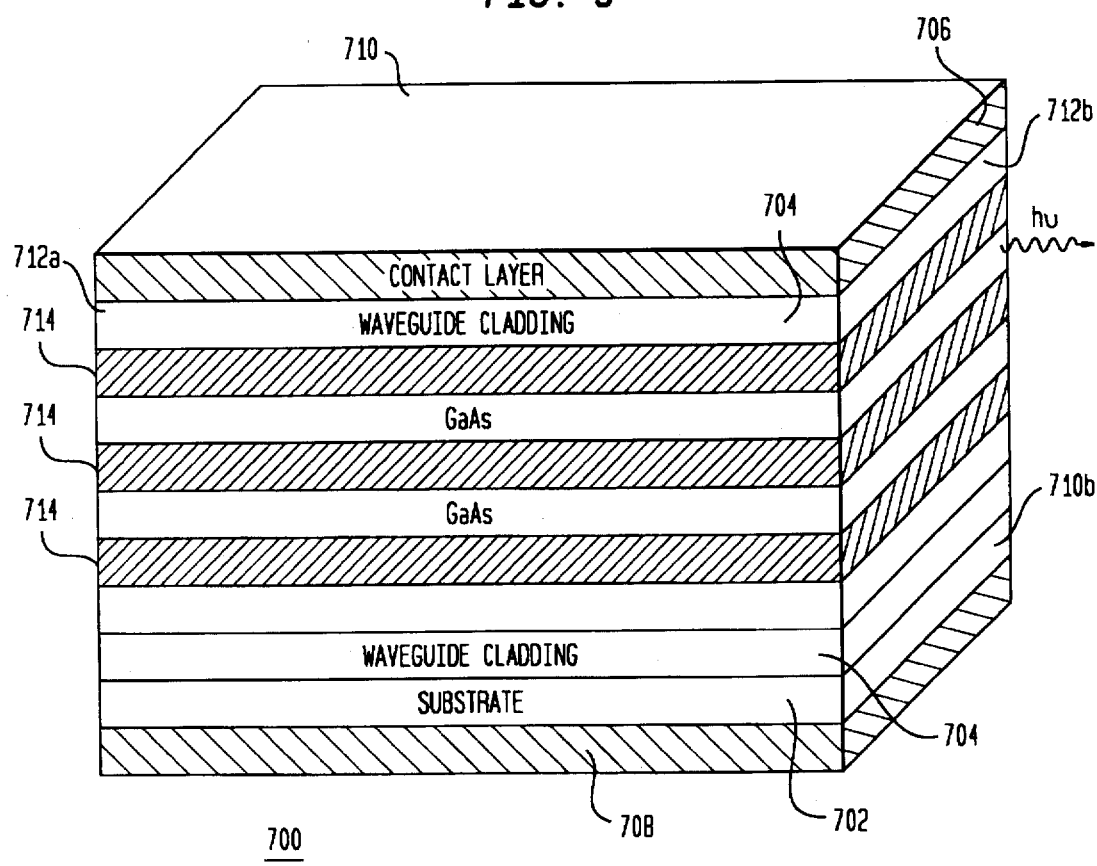
FIG. 3 is an exploded view of a quantum dot cascade laser constructed from the array sandwich of FIG. 2.

To achieve this average density of coupled dots throughout the region occupied by the lasing mode requires a three-dimensional structure. One such preferred structure, as shown in FIG. 3, is a layered structure, comprising a stack of two-dimensional arrays of coupled quantum dots (See FIG. 2) with an overall density sufficient for the gain requirements.

Finally, the threshold current for such a quantum-dot device can be determined. Since radiative decays dominate, the current flowing through each pair of dots need only be adequate to replenish losses due to spontaneous emission. The total spontaneous emission rate is given by:

$$w_{sp} = \frac{4\alpha n \omega_{fi}}{3c^2} |\langle f|\mathbf{r}|i\rangle|^2 \tag{9}$$

$$\simeq \frac{4\alpha n \omega_{fi}}{3} \left(\frac{td}{\hbar c}\right)^2.$$

Using the same parameters as above, a threshold current of $J_f = e\omega_{sp} \approx 1.6$ pA per coupled dot pair is obtained. For a uniform array of dots in three dimensions, this gives a current density of 4.9 mA/cm$^2$. This threshold current density of the quantum-dot device is six-and-a-half orders of magnitude lower than the 14 kA/cm$^2$ required for the quorum-well cascade laser.

With reference to FIG. 3, there is shown a preferred embodiment of a quantum-dot laser constructed according to the teachings of the present invention. Specifically, substrate 702 provides the basic structural support for the laser. The substrate typically is a monocrystalline wafer whose lattice parameters are well suited for growing thereover the various functional layers needed for laser operation while maintaining a high degree of monocrystallinity free from dislocations or defects.

Overlying the substrate 702 is the cladding layer 704 which is suitably reflective of photons generated within double dot array layers 714 and which are constructed as shown previously in FIG. 2.

While only three such double-dot array layers 714 are shown, those skilled in the art can readily appreciate that the number of such layers can be varied to realize effective double-dot density depending upon the particular materials utilized for each layer.

Additionally, it may be desirable to have opposite edges of cladding layer 704 to be highly reflective of emitted radiation, although at least one of the two edges, 712a, 712b should be partially transmissive for laser light to exit.

It is also desirable to provide electrical contacts 708, 710 to substrate 702 and contact layer 706, respectively, to provide a current flow through the structure sufficient to support the lasing.

Finally, it should be readily apparent to those skilled in the art that additional downstream barrier(s) may be advantageously utilized such that escape from the excited state of energy, by tunneling is eliminated, thereby enhancing the overall efficiency of the quantum—dot cascade laser.

The dimensions of the various layers are chosen in accordance with known laser design principles.

A variety of known techniques are available for the production of structures of the kind described, such as molecular beam epitaxy (MBE) or alternatively, chemical vapor deposition (CVD).

While there has been described and illustrated a quantum dot cascade laser, it will be apparent to those skilled in the art that modifications and variations are possible without deviating from the broad principle and spirit of the invention which shall be limited solely by the scope of the claims appended hereto.

What is claimed is:

1. A quantum-dot cascade laser device comprising:

a substrate layer having an electrical contact;

one or more double-dot layers overlying said substrate, each of said double-dot layers having:

an array of double-dots, each having a volume, surrounded by and separated from one another by a semiconductor barrier such that each one of said double-dots is sufficiently-spaced from one another to provide an effective dot density, wherein a double-dot comprises two quantum dots in sufficiently close proximity to allow quantum mechanical tunneling of an electron between the two quantum dots and a quantum dot is a sufficiently small volume of a semiconductor material surrounded on all sides by another suitable material; and a contact layer having an electrical contact and overlying said double-dot layers whereby by the passage of current flow through the device laser operation may be achieved.

2. The quantum-dot cascade laser device according to claim 1 wherein the volume of a downstream double-dot is no larger than 20 $nm^3$.

3. The quantum-dot cascade laser device according to claim 2 wherein the effective dot density is at least one coupled dot pair per 180 $nm^3$ volume.

4. The quantum-dot cascade laser device according to claim 3 further comprising:

a first cladding layer interposed between said quantum-dot layer and said substrate layer, and a second cladding layer interposed between said quantum-dot layer and said contact layer.

5. The quantum-dot cascade laser device according to claim 3 wherein said double-dots are made essentially of GaAs.

6. The quantum-dot cascade laser device according to claim 5 wherein said barrier layers are made essentially of AlGaAs.

7. The quantum-dot cascade laser device according to claim 3 further comprising:

an additional downstream barrier which selectively prevents electron escape by tunneling.

8. The quantum-dot cascade laser according to claim 3 wherein said double dots are made from a Group III—Group V material wherein Group III consists of B, Al, Ca, In, Ti and Group V consists of N, P, As and Bi.

9. The quantum dot cascade laser according to claim 3 wherein said double dots are made from a Group II—Group VI material wherein Group II consists of Zn, Cd, Hg; and Group VI consists of O, S, Se, Te and Po.

* * * * *